US010995914B2

(12) United States Patent
Ooi et al.

(10) Patent No.: US 10,995,914 B2
(45) Date of Patent: May 4, 2021

(54) METHOD OF FABRICATING ORANGE-EMITTING NANOWIRES LEDS

(71) Applicant: King Abdullah University of Science and Technology, Thuwal (SA)

(72) Inventors: Boon S. Ooi, Thuwal (SA); Bilal Janjua, Thuwal (SA); Chao Shen, Thuwal (SA); Chao Zhao, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/686,993

(22) Filed: Nov. 18, 2019

(65) Prior Publication Data
US 2020/0088353 A1  Mar. 19, 2020

Related U.S. Application Data

(63) Continuation of application No. 15/674,275, filed on Aug. 10, 2017, now Pat. No. 10,480,719.
(Continued)

(51) Int. Cl.
*H01L 21/00* (2006.01)
*F21K 9/00* (2016.01)
(Continued)

(52) U.S. Cl.
CPC ............... *F21K 9/00* (2013.01); *H01L 33/06* (2013.01); *H01L 33/08* (2013.01); *H01L 33/32* (2013.01);
(Continued)

(58) Field of Classification Search
CPC ......... F21K 9/00; H04B 10/116; H04B 10/11; H01L 33/06; H01L 33/08; H01L 33/32; F21Y 2115/10; F21Y 2115/30
See application file for complete search history.

(56) References Cited

U.S. PATENT DOCUMENTS 7,714,351 B2    5/2010  Moon et al.
10,480,719 B2 *  11/2019  Ooi ......................... H01L 33/06
(Continued)

OTHER PUBLICATIONS

Aiasaki, et al., "Crystal growth and conductivity control of group III nitride semiconductors and their application to short wavelength light emitteres", Japanese Journal of Applied Physics Part 1—Regular Papers Short Notes & Review Papers, vol. 36, Sep. 1997, 5393-5408.
(Continued)

*Primary Examiner* — Caleb E Henry
(74) *Attorney, Agent, or Firm* — Billion & Armitage

(57) ABSTRACT

Embodiments of the present disclosure describe a white light illumination system using InGaN-based orange nanowires (NWs) LED, in conjunction with a blue LD for high speed optical wireless communications. By changing the relative intensities of an ultrabroad linewidth orange LED and narrow-linewidth blue LD components, a hybrid LED/LD device achieves correlated color temperature (CCT) ranging from 3000 K to above 6000K with color rendering index (CRI) values reaching 83.1. Orange-emitting NWs LED are utilized as an active-phosphor, while a blue LD was used for both color mixing and optical wireless communications.

18 Claims, 3 Drawing Sheets

Related U.S. Application Data

(60) Provisional application No. 62/375,748, filed on Aug. 16, 2016.

(51) Int. Cl.

| | |
|---|---|
| *H01L 33/06* | (2010.01) |
| *H01L 33/08* | (2010.01) |
| *H01L 33/32* | (2010.01) |
| *H04B 10/116* | (2013.01) |
| *H04B 10/11* | (2013.01) |
| *F21Y 115/10* | (2016.01) |
| *F21Y 115/30* | (2016.01) |

(52) U.S. Cl.
CPC ......... *H04B 10/116* (2013.01); *F21Y 2115/10* (2016.08); *F21Y 2115/30* (2016.08); *H04B 10/11* (2013.01)

(56) References Cited

U.S. PATENT DOCUMENTS

| | | | |
|---|---|---|---|
| 2005/0199892 A1 | 9/2005 | Cho et al. | |
| 2005/0206312 A1 | 9/2005 | Cho | |
| 2010/0072498 A1 | 3/2010 | Xie | |
| 2010/0309439 A1 | 12/2010 | Bi | |
| 2011/0297846 A1* | 12/2011 | Wang | H01J 63/06 250/459.1 |
| 2013/0240348 A1 | 9/2013 | Mi | |
| 2015/0155430 A1 | 6/2015 | Li | |
| 2016/0218240 A1* | 7/2016 | Bouvier | H01L 33/62 |
| 2018/0072586 A1* | 3/2018 | Liu | B22F 3/10 |

OTHER PUBLICATIONS

Chow, et al., "Improved modulation speed of LED visible light communication system integrated to main electricity network," Electronics Letters, vol. 47, pp. 867-U1954, Jul. 21, 2011.
Cossu, et al., "3.4 Gbit/s visible optical wireless transmission based on RGB LED," Optics Express, vol. 20, pp. B501-B506, Dec. 10, 2012.
Elgala, et al., "Indoor Optical Wireless Communication: Potential and State-of-the-Art,", IEEE Communications Magazine, vol. 49, Sep. 2011, 56-62.
Eliseev, et al., "Band-tail model and temperature-induced blue-shift in photoluminescence spectra of InxGa1-xN grown on sapphire", Journal of Electronic Materials, vol. 29, Mar. 2000, 332-341.
Grzanka, "Effect of efficiency "droop" in violet and blue InGaN laser diodes", Applied Physics Letters, vol. 95, Aug. 17, 2009.
Guo, et al., "Catalyst-Free InGaN/GaN Nanowire Light Emitting Diodes Grown on (001) Silicon by Molecular Beam Epitaxy", Nano Letters, vol. 10, Sep. 2010, 3355-3359.
Hahn, et al., "Epitaxial Growth of InGaN Nanowire Arrays for Light Emitting Diodes", Published in ACS Nano, 5(5) by Christopher Hahn, 2011, 3970-3976.
Hanzo, et al., "Wireless Myths, Realities, and Futures: From 3G/4G to Optical and Quantum Wireless," Proceedings of the Ieee, vol. 100, pp. 1853-1888, May 2012.
Hashimoto, et al., "High-efficiency green-yellow light-emitting diodes grown on sapphire (0001) substrates", Physica Status Solidi C: Current topics in Sold State Physics, vol. 10, No. 11, vol. 10, 2013, 1529-1532.
Janjua, "Going beyond 4 Gbps data rate by employing RGB laser diodes for visible light communication," Optics Express, vol. 23, pp. 18746-18753, Jul. 13, 2015.
Khalid, et al., "1-Gb/s Transmission Over a Phosphorescent White LED by Using Rate-Adaptive Discrete Multitone Modulation," Ieee Photonics Journal, vol. 4, pp. 1465-1473, Oct. 2012.
Kikuchi, et al., "InGaN/GaN Multiple Quantum Disk Nanocolumn Light-Emitting Diodes Grown on (111) Si Substrate", Jpn. J. Appl. Phys., 43,, Nov. 5, 2004, 1524-1526.
Lai, et al., "High-Efficiency InGaN=Based Yellow-Green Light-Emitting Diodes", Japanese Journal of Applied Physics, vol. 49, 2010.
Lee, et al., ., "2 Gbit/s data transmission from an unfiltered laser-based phosphor-converted white lighting communication system," Optics Express, vol. 23, pp. 29779-29787, Nov. 16, 2015.
Lu, et al., "Phosphor-free monolithic white-light LED", IEEE Journal of Selected Topics in Quantum Electronics, vol. 15, No. 4, Jul./Aug. 2009.
Nakamura, et al., "High-Brightness Ingan/Algan Double-Heterostructure Blue-Green-Light-Emitting Diodes", Journal of Applied Physics, vol. 76, Dec. 15, 1994, 8189-8191.
Nakamura, "Present performance of InGaN based blue/green/yellow LEDs", Light-Emitting Diodes: Research, Manufacturing, and Applications, vol. 3002, 1997, 26-35.
Narukawa, et al., "White light emitting diodes with super-high luminous efficacy", Journal of Physics D-Applied Physics, vol. 43, Sep. 9, 2010.
Neumann, et al., "Four-color laser white illuminant demonstrating high color-rendering quality," Optics Express, vol. 19, pp. A982-A990, Jul. 4, 2011.
Takeuchi, et al., "Quantum-confined start effect due to piezoelectric fields in GaInN strained quantum wells", Japanese Journal of Applied Physics Part 2—Letters, vol. 36, Apr. 1, 1997, L382-L385.
Tsao, et al., "Toward Smart and Ultra-efficient Solid-State Lighting," Advanced Optical Materials, vol. 2, pp. 809-836, Sep. 2014.
Tsao, "Solid-state lighting: Lamps, chips and materials for tomorrow", 2005 Conference on Lasers & Electro-Optics (CLEO) vol. 1-3, 2005, 143.
Tsonev, et al., "Towards a 100 Gb/s visible light wireless access network," Optics Express, vol. 23, pp. 1627-1637, Jan. 26, 2015.
Vucic, et al., "230 Mbit/s via a Wireless Visible-Light Link based on OOK Modulation of Phosphorescent White LEDs,", 2010 Conference on Optical Fiber Communication Ofc Collocated Natinal Fiber Optic Engineers Conference Ofc-Nfoec, 2010.
Woo, et al., "Atomic Ordering in InGaN Alloys within Nanowire Heterostructures", Nano Letters, vol. 15, Oct. 2015, 6413-6418.
Wu, et al., "3.22-Gb/s WDM Visible Light Communication of a Single RGB LED Employing Carrier-Less Amplitude and Phase Modulation", 2013 Optical Fiber Communication Conference and Exposition and the National Fiber Optic Engineers Conference (Ofc/NFoec),, 2013.
Yamamoto, et al., "High-Efficiency Single-Quantum-Well Green and Yellow-Green Light-Emitting Diodes on Semipolar (20(2)overbar1) GaN Substrates," Applied Physics Express, vol. 3, 2010.
Yeh, et al., "Investigation of 4-ASK modulation with digital filtering to increase 20 times of direct modulation speed of white-light LED visible light communication system," Optics Express, vol. 20, pp. 16218-16223, Jul. 16, 2012.
Zhao, et al., "Facile Formation of High-Quality InGaN/GaN Quantum-Disks-in-Nanowires on Bulk-Metal Substrates for High-Power Light-Emitters," Nano Letters, vol. 16, pp. 1056-1063, Feb. 2016.
Zou, et al., "High-Performance Green and Yellow LEDs Grown on SiO2 Nanorod Patterned GaN/Si Templates," Ieee Electron Device Letters, vol. 34, pp. 903-905, Jul. 2013.

\* cited by examiner

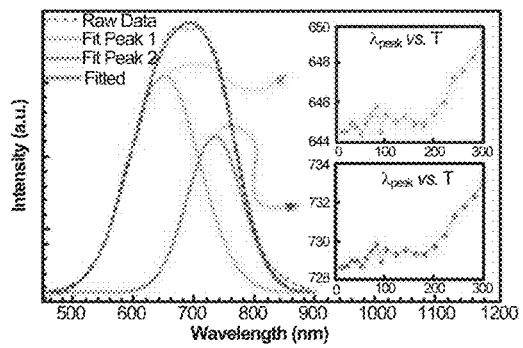
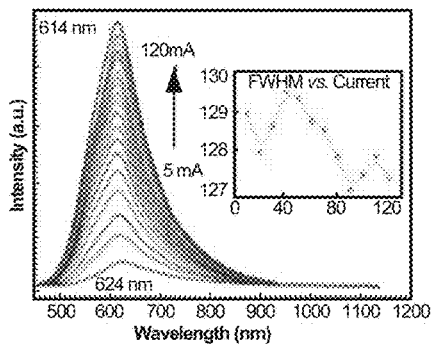
FIG. 3A  FIG. 3B
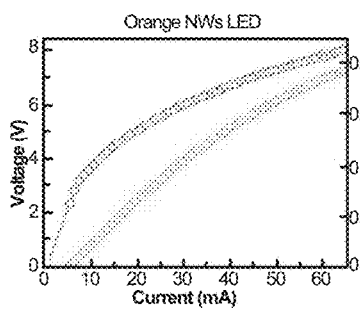
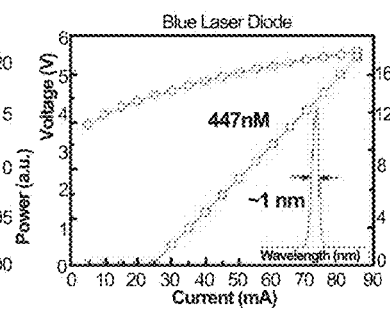
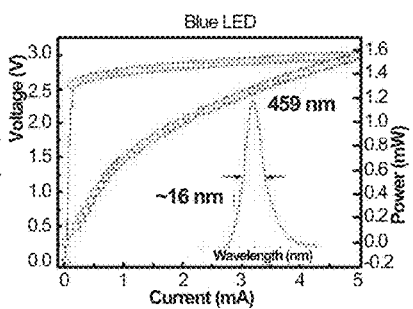
FIG. 4A  FIG. 4B  FIG. 4C
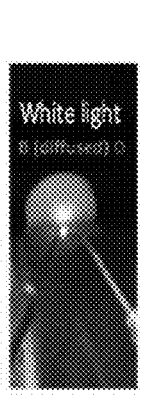
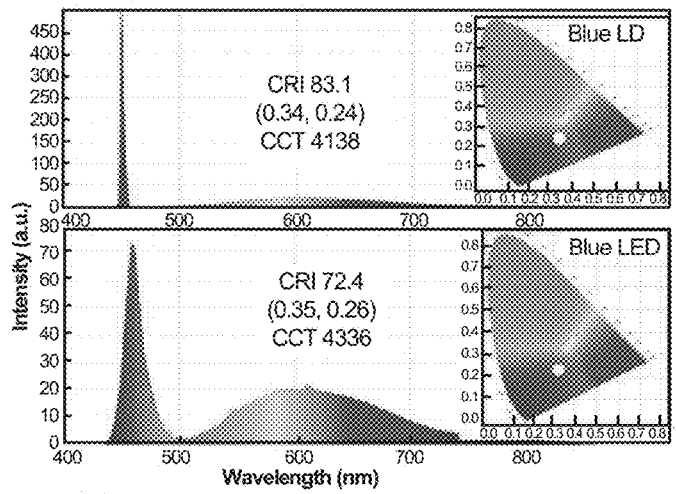
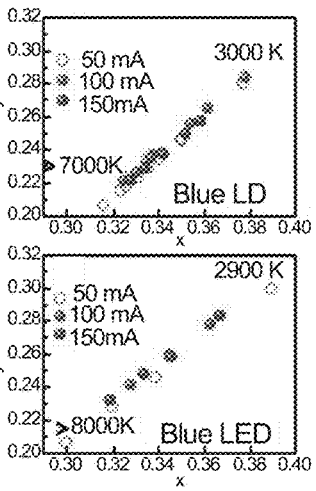
FIG. 5A  FIG. 5B  FIG. 5C  FIG. 5D  FIG. 5E

... ...

METHOD OF FABRICATING ORANGE-EMITTING NANOWIRES LEDS

CROSS-REFERENCE TO RELATED APPLICATION(S)

This application is a continuation application of U.S. application Ser. No. 15/674,275, filed Aug. 10, 2017, now U.S. Pat. No. 10,480,719, which claims the benefit of and priority to U.S. Provisional Application No. 62/375,748, filed Aug. 16, 2016, each of which are incorporated by reference herein.

BACKGROUND

Group-III-nitride laser diode (LD)-based solid-state lighting devices are well known, are relatively droop-free compared to other light-emitting diodes (LEDs), and are energy-efficient compared to that of the traditional incandescent and fluorescent white light systems. The YAG:$Ce^{3+}$ phosphor used in LD-based solid-state lighting, however, is limited by rapid degradation leading to reduction in efficiency and poor performance. As a result, a need remains for an alternate architecture capable of sustaining high temperature, high power density, while being intensity- and bandwidth-tunable for high color-quality.

In considering the development of next generation lighting and communication applications, a major goal includes robust and efficient hybrid devices and systems capable of both white light generation and high speed optical wireless communications (OWC).

SUMMARY

In general, embodiments of the present disclosure describe white light generation using an InGaN-based orange nanowires (NWs) LED grown on silicon, in conjunction with a blue LD for high speed optical wireless communications. By changing the relative intensities of an ultrabroad linewidth orange LED and narrow-linewidth blue LD components, a hybrid LED/LD device achieves correlated color temperature (CCT) ranging from 3000 K to above 6000K with color rendering index (CRI) values reaching 83.1, a value unsurpassed by the YAG-phosphor/blue-LD counterpart. In one example, a white-light wireless communication system is implemented using a blue LD through on-off keying (OOK) modulation to obtain a data rate of 1.06 Gbps. Orange-emitting NWs LED were utilized as an active-phosphor, while a blue LD was used for both color mixing and optical wireless communications.

Visible lighting and image projection systems have attracted considerable attention because of relatively small foot-prints, long lifetime, stable light-output, low power consumption and heat generation, and high-speed modulation capability. The high-speed modulation characteristic is particularly desirable for optical wireless communications (OWC) devices or systems. Radio frequency (RF) communications, as the primary source of wireless communications, has experienced bandwidth limitations due to the recent unprecedented increase in demand for higher data rates transmissions. Substitute frequency bands, especially the unregulated optical frequencies in the visible region remain a promising alternative to the overburdened RF spectrum. Switching to visible frequencies will also reduce reliance on hardware while providing diverse options of high speed communications with large bandwidths.

Research has primarily been focused on indoor applications of OWC. To achieve white light, most conventional techniques utilize blue LED to excite yellow phosphor with highest reported luminous efficacy of 265 lm/watt, or combining red, green and blue (RGB) LEDs to achieve a broad white light spectrum. Phosphor based technique suffers from limited controllability of the yellow phosphor component in producing the desired white light characteristics. Also, a longer carrier relaxation lifetime in YAG:$Ce^{3+}$ phosphor inhibits GHz communications, unless spectral-efficient modulation technique is utilized. For example, advanced communications schemes such as wavelength division multiplexing (WDM) and multiple-input and multiple-output (MIMO) have been adopted with the RGB LEDs triplet setup to achieve date throughput beyond 3 Gbps.

Advancement of the technology further requires an optical device with significantly higher efficiency and greater bandwidth. This gap can be fulfilled by utilizing laser diodes (LDs) which exhibit efficient electrical to optical efficiency, narrower linewidth compared to LED and support considerably higher parallel data channels with significantly lower interference. Beyond-100-Gbps data rates have been theorized using optimized orthogonal frequency-division multiplexing (OFDM) encoding technique. By mixing three primary colors (red, green, and blue, i.e. RGB), one can produce white light with varying color temperatures. However, RGB triplets suffer from an inherent drawback of narrow linewidth which does not fill the visible spectrum, resulting in the poor rendering of colors of the illuminated object. One known approach utilized the RYGB configuration with very promising results but the yellow optical source utilized was based on sum frequency generation which significantly reduces the cost effectiveness of the system.

It is apparent that a new white-lamp architecture for simultaneous lighting and communications should comprise coherent, small linewidth LD-spectrum, and the broad linewidth LED-spectrum. Although, this LED/LD combination is an attractive solution for high efficiency white lighting and high bandwidth visible light communications (VLC), the development has been impeded by the lack of high-quality material and reduced efficiency in the "green gap". Also, efficiency droop, a decrease in device efficiency with increase in operating bias current, has been a bottleneck in planar nitride devices. LEDs emitting in green-yellow regime have been demonstrated but the inherent problems of smaller linewidth (<60 nm), efficiency droop, and lower internal quantum efficiency of the quantum well based planar structures, limit their deployment as an efficient yellow-orange-red wavelength source for white light generation.

Examples of the present disclosure utilize a nanowires LED for both intensity and color tunability functions. The novel implementation utilizes a hybrid combination of nanowires-LED and LD, either in the form of discrete components (as further described herein) or monolithic integration of multiple color nanowires-LED/laser on a silicon chip or related substrate. Furthermore, examples of the present disclosure provide simultaneous implementation of laser and active-phosphor based on nanowire-LED for concurrent realization of solid-state lighting and data communications. A system with wide color tunability and simultaneous LED-laser integration to yield optical wireless data communications capability is described herein.

Accordingly, embodiments of the present disclosure describe a hybrid illumination system including an InGaN-based orange nanowires LED in combination with a blue LD for high speed optical data communications.

Embodiments of the present disclosure further describe a method implementing a white light illumination system including an InGaN-based orange nanowires LED in conjunction with high speed optical communication.

The details of one or more examples are set forth in the description below. Other features, objects and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which:

FIG. 3(a) illustrates a graphical view of intensity and wavelength characteristics of a NWs LED evaluated using temperature dependent photoluminescence, according to one or more embodiments of the present disclosure.

FIG. 3(b) illustrates a graphical view of intensity and wavelength characteristics of a NWs LED with varying bias currents, according to one or more embodiments of the present disclosure.

FIG. 4(a) illustrates a graphical view of I-V characteristics of orange NWs LED, according to one or more embodiments of the present disclosure.

FIGS. 4(b) and 4(c) illustrates a graphical view of L-I-V characteristics of a blue LD, according to one or more embodiments of the present disclosure.

FIGS. 5(a)-(e) illustrate a graphical comparison between blue LD and blue LED.

DETAILED DESCRIPTION

Figure 1:
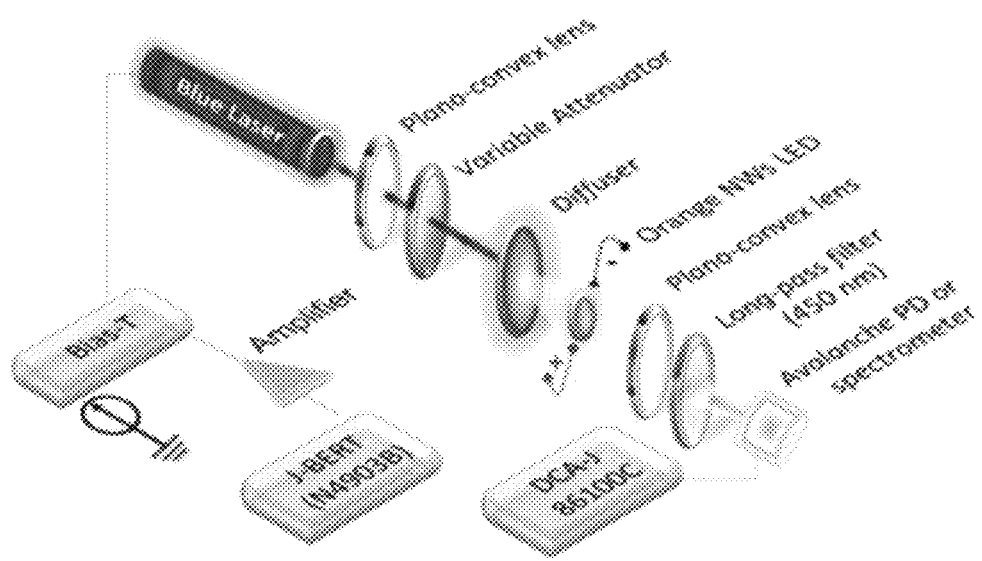
FIG. 1 illustrates a schematic implementation of an illumination and optical wireless communications system, according to one or more embodiments of the present disclosure.

The invention of the present disclosure relates to a white light device architecture suitable for illumination and optical wireless communications. In particular, one example of the present disclosure provides an ultra-broad linewidth orange NWs LED and blue LD combined to achieve both white light generation and optical wireless communication. The architecture of the present disclosure can be applied to next-generation high efficiency indoor illumination and optical wireless communication systems. In addition, examples of the present disclosure can provide simultaneous lighting and communications including a coherent, small linewidth LD-spectrum, and broad linewidth LED-spectrum. These examples, however, should not be viewed as limiting, as the devices of the present disclosure can be used in innumerable applications, especially with respect to next generation illumination and communications systems.

One embodiment of the present disclosure utilizes an orange emitting LED based on a platform of InGaN/GaN NWs grown on titanium-coated silicon substrate, as well as a narrow linewidth laser for simultaneous color mixing for solid state lighting (SSL) and data communications. White light achieved using the NWs-LED/LD device combination yielded a color rendering index (CRI) beyond 80, surpassing that of the phosphor/blue-LD combination with CRI of less than 70, and large tunability of correlated color temperature (CCT). By utilizing the blue LD in conjunction with OOK modulation technique, data rates of 1.06 Gbps were obtained. This hybrid system thus provided performance within the high speed OWC regime.

Accordingly, embodiments of the present disclosure describe white-light illumination devices with optical wireless communication capabilities, as well as methods of illuminating with high quality white light and communicating via optical wireless communications.

Embodiments of the present disclosure describe nanowires (NWs) based devices yielding reduced defect density, improved light-extraction with a larger surface to volume ratio, and increased internal quantum efficiency due to a reduced lattice-strain, thus considerably mitigating efficiency droop.

Embodiments of the present disclosure utilize an orange emitting LED based on a new platform of InGaN/GaN NWs grown on titanium-coated silicon substrate, as well as a narrow linewidth laser for simultaneous color mixing for solid state lighting (SSL) and data communications. White light achieved using the NWs-LED/LD device combination yielded a color rendering index (CRI) beyond 80, surpassing that of the phosphor/blue-LD combination with CRI of less than 70, and large tunability of correlated color temperature (CCT). By utilizing the blue LD in conjunction with OOK modulation technique, data rates of 1.06 Gbps were obtained. This hybrid system thus provided performance within the high speed OWC regime.

EXAMPLES

The orange NWs LED was grown using GEN 930 plasma-assisted molecular beam epitaxy (PA-MBE) system. Native oxide was removed from a silicon substrate using $HF-H_2O$ solution followed by deposition of 100 nm of titanium (Ti). The silicon (Si) doped gallium nitride (GaN) was first nucleated at a lower substrate temperature of 500° C. followed by growth at a higher temperature of 600° C. for crystal quality improvement. Nitrogen ($N_2$) flow was maintained at 1 sccm with RF power set to 350 W. Active region was grown using seven stacks of GaN quantum barrier (8 nm) and InGaN quantum disk (4 nm). The quantum disks were grown at a lower temperature of 515° C. followed by capping of 2 nm of GaN, to avoid dissociation when ramping up for quantum barrier growth. Indium (In) beam equivalent pressure (BEP) was set at $5\times10^{-8}$ Torr while for Gallium (Ga) it was varied between $3\times10^{-8}$-$6\times10^{-8}$ Torr. A 60 nm thick magnesium-doped GaN was then grown. Titanium nitride (TiN) has been seen to form at NWs base at the nucleation site, as confirmed by TEM and XRD, which considerably improves current injection. TiN in conjunction with underlying Ti layer reflects longer wavelength photons which also considerably increases light extraction efficiency of the device.

The orange NWs LED was fabricated using standard UV contact lithography process. The NWs were first planarized with parylene, etched back to reveal the p-GaN contact layers, and then deposited with Ni (5 nm)/Au (5 nm), which forms an ohmic contact with p-GaN upon annealing. The LED mesa was then etched and the Ti buffer layer supporting the NWs was revealed as the n-contact metal. Then 500 nm of Au pad was sputtered to complete the top contact pads.

FIG. 1 describes an implementation of an illumination and communications system where a blue LD 12 is used in conjunction with orange NWs LED 14 to generate white light. Blue LD 12 (LP450-SF-15 from Thorlabs) exhibited a nominal spectral linewidth of around 1 nm centered at 447 nm. A commercial blue LED with peak emission at ~460 nm was used to compare the white light characteristics. The light beam from blue LD 12 passes through diffuser 16. A plano-convex lens 18 (LA1951-A) was used in front of blue LD 12 to collimate the laser beam. A variable attenuator 20 is provided to match transmitter and receiver levels. To obtain white light, the beam was passed through diffuser 16 (ED1-050-MD) and mixed with light from orange NWs LED 14. The mixed light was then passed through plano-convex lens 22 and long pass filter 24. Avalanche PD or spectrometer 30 receives light passing through filter 24. The mixed white light was then measured using the GL Opti-probe attachment, fiber-coupled into the GL Spectis 5.0 Touch spectrometer.

FIG. 1 further describes a schematic of the On-Off Keying Non-return-to-zero (NRZ-OOK) modulation setup for the orange NWs LED/blue LD architecture for optical wireless communications (OWC) and white-light generation. For comparison of white light quality, either a LD or a LED was used to generate blue light and then combined with orange light from NWs LED, without the modulation signal. The white light characteristics were measured using GL-Spectis 5.0 Touch spectrometer without the plano-convex lens and long-pass filter (located after the orange NWs LED), and without the avalanche PD or spectrometer 30 or digital communication analyzer (DCA-J 86100C) 32.

For modulating the blue LD 12, DC biasing current ($I_{bias}$) and peak-to-peak modulation current ($I_{pp}$) were adjusted to optimize the signal-to-noise ratio (SNR) of the transmission. The 1.06 Gbps on-off keying non-return-to-zero (NRZ-OOK) laser modulation was realized with a pseudorandom binary sequence (PRBS) generator 34 (Agilent Technologies J-BERT) having a $2^{10}-1$ long words. The $2^{10}-1$ long PRBS pattern was consistent with data pattern length found in applications such as Gigabit Ethernet, and SATA 1 that use 8b/10b, as well as other related encodings. The NRZ-OOK data was electrically pre-amplified with an ultra broadband amplifier 36 (Picosecond Pulse Labs, 5868) of 28.5 dB gain to increase the RF signal power and improve the extinction ratio (ER). The transmitted NRZ-OOK optical signal was sent to the APD receiver for optical-to-electrical conversion and error detection measurements using an Agilent Technologies Digital Communication Analyzer (DCA-J 86100C).

Figures 2A, 2B, 2C:
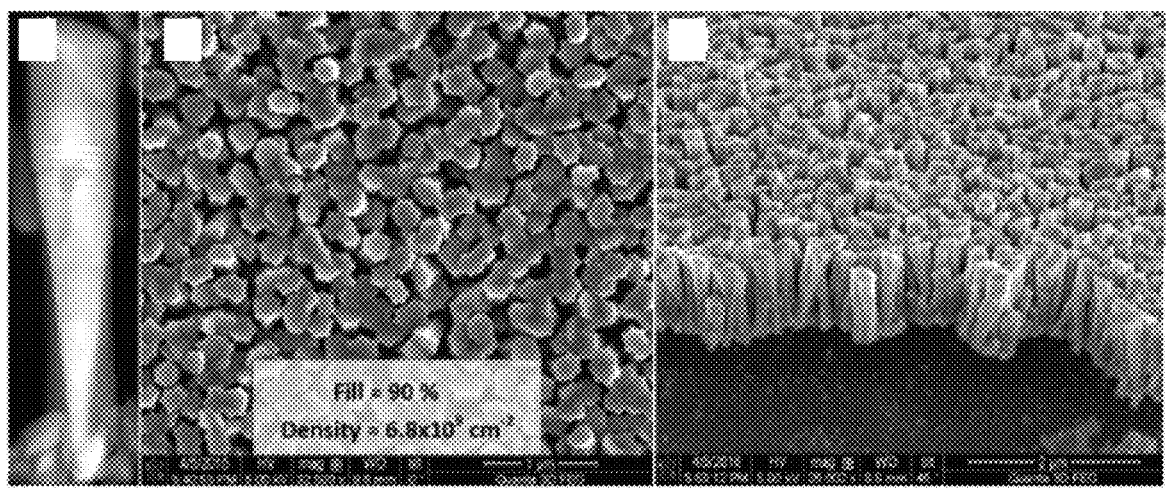
FIG. 2(a) illustrates a TEM image of a NWs LED, according to one or more embodiments of the present disclosure.
FIG. 2(b) illustrates a top view SEM image of a plurality of NWs LEDs, according to one or more embodiments of the present disclosure.
FIG. 2(c) illustrates a perspective SEM image of a plurality of NWs LEDs, according to one or more embodiments of the present disclosure.

FIG. 2(a) is a transmission electron microscopy (TEM) image of a NWs LED 38 sample clearly show the well-defined InGaN quantum disks 40 (white horizontal lines) embedded in body of the NWs LED 38 and separated by GaN quantum barriers. The tapered NWs LED 38 nucleate with a small base and the lateral size gradually increases as growth progresses. This is attributed to the decrease in temperature with NWs LED 38 height thus favoring lateral growth. In FIG. 2(a), the TEM image of a single tapered NWs LED 38 shows 7 stacks of InGaN quantum disks (white horizontal lines) sandwiched in between GaN barrier.

FIG. 2(b) is a top view scanning electron microscope (SEM) image of the InGaN NWs LEDs showing the NWs LED's mean height of 800 nm and lateral size of 175 nm. FIG. 2(c) shows that the NWs LEDs were mostly vertically aligned and disjointed with an areal density of $6.8 \times 10^9$ cm$^{-2}$ and fill factor of 90%.

The optical properties the NWs LEDs were evaluated using temperature dependent photoluminescence (PL) as shown in FIG. 3(a). A broad PL linewidth of 184 nm was obtained at room temperature and was attributed to the presence of compositional inhomogeneity and alloy disordering among the nanowires and across individual quantum disks. Insets show weak S-shape evolution of the peak wavelengths versus temperature for the two deconvoluted-peaks, which are in the orange-red and far-red color regime, respectively.

The ultrabroad linewidth is particularly desirable for generating high CRI white light as evident in the room temperature electroluminescence measurement of an orange LED in FIG. 3(b). With further band-filling effect in the electronic transitions of the clusters of NWs, the emission peak wavelength and linewidth were found to be 614 nm (orange color) and above 120 nm, respectively. In particular, the peak exhibit weak shift with the increase in current injection which is usually the case for quantum well based InGaN planar devices in the presence of high polarization fields. This provided evidence of minimized polarization fields due to smaller crystal volume and inherent lower strain in the nanowires, which nucleate via strain relaxation. As the EL peak correlates well with that of PL, a desired broad linewidth emission was achieved.

FIG. 3(a) discloses PL intensity versus wavelength at room temperature fitted with 2 Gaussian peaks. The evolution of the peak wavelength ($\lambda_{peak}$) with temperature (T) are shown in the top and bottom insets, respectively.

FIG. 3(b) illustrates EL spectra of the orange NWs LED with varying bias current from 5 to 120 mA, showing a blue shift of 10 nm. An inset shows an ultrabroad linewidth of above 120 nm at high injection current, as obtained by integrating the spectrum.

The L-I-V characteristics of the orange NWs LED was characterized at different biases as shown in FIG. 4(a). A turn-on voltage of 4.2 V was obtained which was relatively larger than its planar counterpart. This could result from the presence of higher contact resistance at the top p-GaN layer and insertion of AlGaN carrier blocking layers. An important feature to be noted is that no saturation in power was observed up to 70 mA of current injection.

FIGS. 4(b) and 4(c) show the L-I-V characteristics of the blue LD having a threshold current of 34.0 mA, 22.2% differential efficiency with peak wavelength at 447 nm and linewidth of 1 nm, while the blue LED having a turn on voltage of ~2.6 V with peak wavelength of 459 nm and linewidth of 16 nm, respectively. Due to optical coupling and optical fiber losses, the LD shows a flat power response up to injection current of 25 mA.

For the white light experiment, the bias current for the blue LD was kept at the optimum operating condition of 39 mA. The intensity level of the ultrabroad linewidth orange LED was varied to improve white light characteristics by changing the bias current from 50 mA to 200 mA. In parallel, the intensity of blue LD was also adjusted using a variable attenuator keeping the bias at 39 mA. It was seen that the white light color temperature drastically changed with the blue light intensity. For the blue LED, the intensity was adjusted by varying the voltage. In FIGS. 5(b) and 5(c) the diffused white light spectral characteristics, which correspond to the integrated intensity ratio between the blue light and orange light, along with the color rendering index (CRI) and the correlated color temperature (CCT) based on CIE 1931 standard were measured with a GL Opti-probe connected to GL Spectis 5.0 Touch spectrometer. When the orange LED was operated at a bias current of 140 mA, a CCT value of 4138 K and a CRI of 83.1 were obtained as shown in FIG. 5(b). As compared to the case when using blue LD to excite single-crystal YAG phosphor with the resultant linewidth of ~100 nm, a CRI of mere 58 was reported. The blue laser based white lighting using orange NWs LED is thus a better candidate for achieving a prominent CRI.

The white light spectra generated using orange LED with blue LD—FIG. 5(b), and blue LED-FIG. 5(c) yielded CRI values of 83.1 and 73.4, respectively, with the respective color coordinates and CCT values indicated. The white spots in the chromaticity diagrams correspond to these values. In selecting the best CRI, the injection current for the orange LED was fixed at 50, 100, or 150 mA, while the intensity of the blue component was varied by simply rotating the variable attenuator wheel in case of LD and by changing the voltage bias for the LED, thus resulting in the progression in CCT as shown in FIGS. 5(d) and 5(e), respectively.

CRI provides a quantitative measure of the degree of a light source revealing the color of an object under consideration, when compared to a Planckian light source having the same Kelvin temperature. As shown in FIG. 5(c), considerably good white light characteristics can be achieved with both blue LD and LED. Compared to a Planckian radiator emitting around 4000 K, the LD light, having smaller linewidth, reveal the color of an object more faithfully compared to that of a blue LED with a much wider linewidth. Thus blue LD, compared to LED exhibits higher CRI value. Color temperatures were seen to drastically change with blue light intensity as shown in FIGS. 5(d) and 5(e).

Figure 6A:
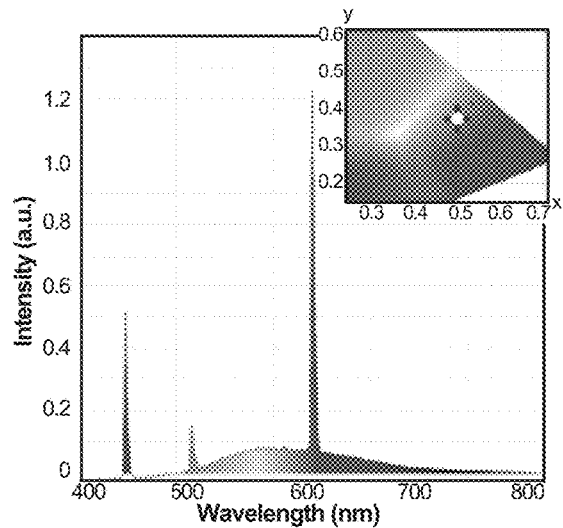
FIGS. 6(a) and 6(b) illustrate white light spectra and CRI coordinates of a comparable system utilizing RG LEDs.
Figure 6B:
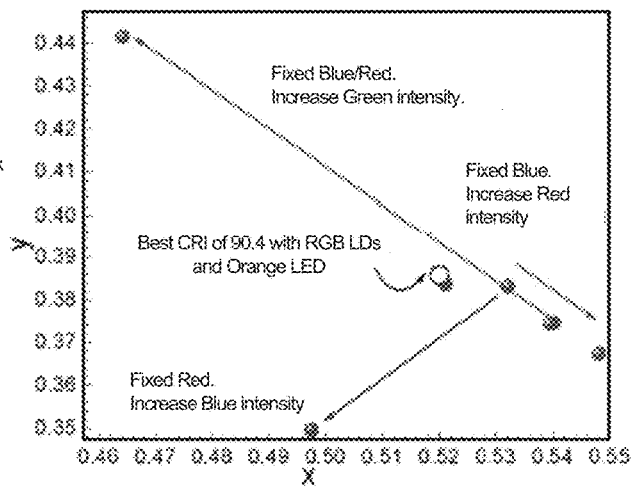

In another experiment, RG LDs component at 532 nm and 640 nm were introduced and CRI values above 90 were obtained but at the cost of color temperature which went below 2000 K as shown in FIGS. 6(a) and 6(b). This further elucidated the strength of the novel orange NWs LED/blue LD device architecture. FIG. 6(a) illustrates white light spectra generated using RGB LD and orange LED for the best CRI value with the corresponding CRI coordinate (white spot with cross) shown in the inset. FIG. 6(b) illustrates CRI coordinates achieved by varying the intensities of the RGB LDs or LEDs to change the color temperatures and to achieve the best CRI value as indicated. A CRI of 90.4 was obtained but at the cost of poor CCT (1920 K).

Figure 7A:
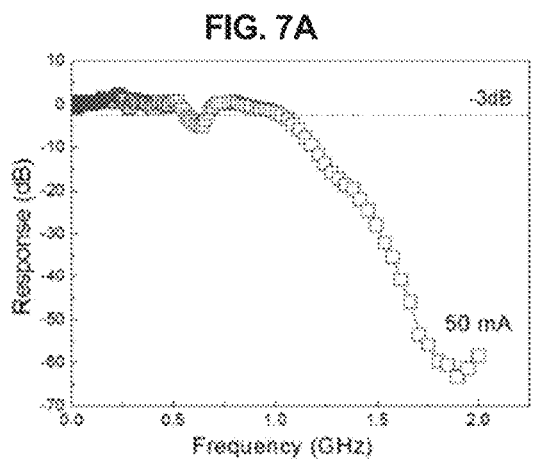
FIGS. 7(a)-(d) illustrate maximum allowable modulation bandwidth, and a relationship between bit error rate and current.

High speed data communications capabilities were also analyzed. FIG. 7(a) illustrates maximum allowable modulation bandwidth. The small signal response at 50 mA DC bias current, i.e. the ~3 dB bandwidth of the communications system (inclusive of the blue LD, the laser driver, and the APD) is 1.02 GHz. As compared to an LED, this is two orders of magnitude enhancement in modulation bandwidth, and therefore the use of a blue LD serves well in high data rate OWC.

FIG. 7(a) illustrates a relationship between bit error rate (BER) and current. The optimum current of 39 mA was chosen for further BER optimization by varying the peak-to-peak voltage. The eye diagrams for the best BER obtained with OOK encoding at FIG. 7(c) 0.622 Gbps, and FIG. 7(d) 1.06 Gbps.

Figure 7B:
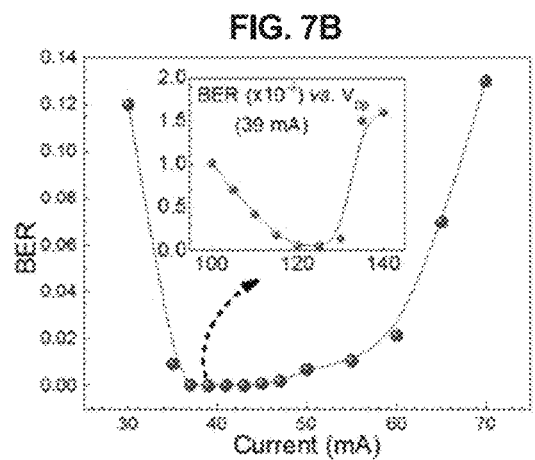
Figure 7C:
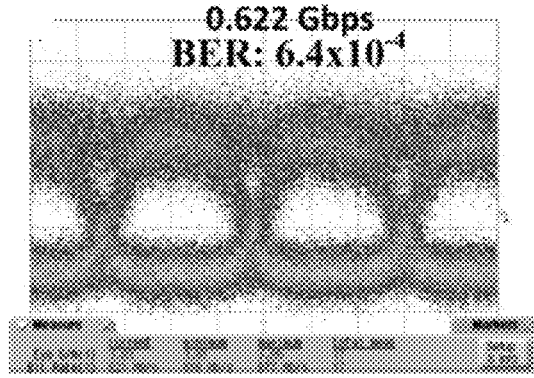
Figure 7D:
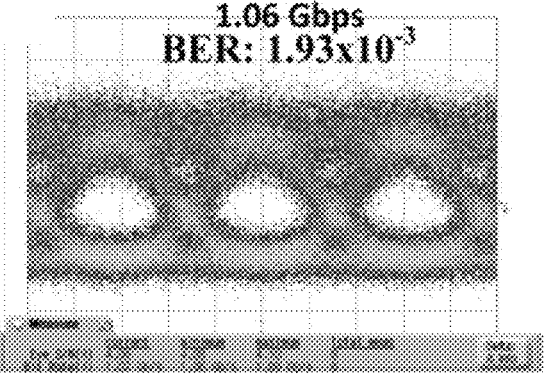

It is noted that prior to OWC measurement, the modulation performance in terms of BER of the blue LD encoded signals was investigated under different bias currents and peak-to-peak voltage as shown in FIG. 7(b) and the inset, respectively, in order to find an optimum operating point. The power reaching the PD was kept constant at 20 µW by using a variable attenuator for the above optimization. An optimized operating condition was obtained when the bias current of the blue LD was set to 39 mA and the amplitude of the modulating voltage signal to 125 mV as shown in FIG. 6(b). At a lower bias current, clipping of the modulated signal was observed, which degraded the BER of the encoded OOK data stream. An overly biased operation also declines the laser throughput response, and degrades the high-frequency response which increases the transmitted BER. By using the system depicted in FIG. 1 and the optimized operating condition described above, a transmission rate of up to 1.06 Gbps was achieved. The eye diagrams at 0.622 Gbps and 1.06 Gbps measured using an Agilent digital communication analyzer (DCA) are shown in FIGS. 7(c) and 7(d). At 0.622 Gbps and 1.06 Gbps, with the corresponding BER of $6.4\times10^{-4}$ and $1.93\times10^{-3}$ below the forward error correction (FEC) criterion of $3.8\times10^{-3}$, error-free operation was realized.

The present disclosure thus describes a white light device architecture based on ultrabroad linewidth orange NWs LED and <1 nm linewidth blue LD to achieve both white light generation and optical wireless communication (OWC). The PAMBE grown NWs were observed to be vertically aligned with density, diameter and length of $6.8\times10^{9}$ cm$^{-2}$, 175 nm and 800 nm, respectively. The emitted spectrum under 120 mA bias current had a peak wavelength of 614 nm with invariant shift as the bias current increases. A high data transmission rate of 1.06 Gbps was achieved without the need of an optical blue-filter based on NRZ-OOK modulation scheme. At 1.06 Gbps transmission, open eye diagrams and FEC compliant BER of $1.93\times10^{-3}$ were successfully obtained. In addition, colorimetric properties of the white light source were characterized. At 140 mA injection current, white light with a CCT of 4138 K and a CRI of 83.1 was achieved, a value unmatched by the blue LD—phosphor counterpart. The demonstrated ultrabroad linewidth orange NWs LED in conjunction with narrow linewidth blue LD based white light source will be applicable for next-generation high-efficiency indoor illumination and optical wireless communications systems.

Other embodiments of the present disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto Various examples have been described. These and other examples are within the scope of the following claims.

What is claimed is:

1. A method of fabricating orange nanowire light emitting diodes (LEDs), the method comprising:
depositing a layer of titanium on a silicon substrate to provide a titanium-coated silicon substrate; and
utilizing plasma-assisted molecular beam epitaxy (PA-MBE) to epitaxially deposit a plurality of indium gallium nitride (InGaN)/gallium nitride (GaN) nanowires extending from the titanium-coated silicon substrate;
wherein epitaxially depositing a plurality of InGaN/GaN nanowires includes first nucleating silicon doped GaN at a first temperature on the layer of titanium and growth at a second temperature, wherein the second temperature is higher than the first temperature.

2. The method of claim 1, wherein the InGaN/GaN nanowires include a plurality of GaN quantum barriers and InGaN quantum disks located between the GaN quantum barriers.

3. The method of claim 2, wherein each of the GaN quantum barrier layers are approximately 6-10 nanometers.

4. The method of claim 2, wherein each of the GaN quantum barrier layers are approximately 8 nanometers.

5. The method of claim 3, wherein each of the InGaN quantum disks are approximately 3-5 nanometers.

6. The method of claim 4, wherein each of the InGaN quantum disks are approximately 4 nanometers.

7. The method of claim 1, wherein epitaxially depositing a plurality of InGaN/GaN nanowire further includes growth at a third temperature to form the InGaN quantum disks between the GaN barrier layers, wherein the third temperature is higher than the first temperature and lower than the second temperature.

8. The method of claim 7, wherein the first temperature is greater than or equal to approximately 500° C.

9. The method of claim 7, wherein the second temperature is greater than or equal to approximately 600° C.

10. The method of claim 7, wherein the third temperature is greater than or equal to approximately 515° C.

11. The method of claim 1, wherein titanium nitride (TiN) is formed at a base of the nanowires.

12. The method of claim 2, further comprising growing a layer of magnesium-doped GaN on the stacks of GaN quantum barrier and indium gallium nitride (InGaN) quantum disks.

13. The method of claim 1, further comprising revealing the layer of titanium between the nanowires to form an n-contact.

14. A method of fabricating orange nanowire light emitting diodes (LEDs), the method comprising:
depositing a layer of titanium on a silicon substrate to provide a titanium-coated silicon substrate; and
forming indium gallium nitride (InGaN)/gallium nitride (GaN) nanowires using a plasma-assisted molecular epitaxy (PA-MBE) system to grow:
a layer of silicon doped gallium nitride (GaN) on the layer of titanium;
stacks of GaN quantum barrier layers and indium gallium nitride (InGaN) quantum disk layers on the layer of silicon doped gallium nitride; and
a layer of magnesium-doped GaN on the stacks of GaN quantum barrier and indium gallium nitride (InGaN) quantum disks.

15. The method of claim 14, further comprising revealing the layer of titanium between the nanowires to serve as an n-contact metal.

16. The method of claim 14, wherein growing the stacks includes growing InGaN quantum disk layers at a temperature less than a temperature used to grow the layer of silicon doped GaN.

17. A method of fabricating orange nanowire light emitting diodes (LEDs), the method comprising:
depositing a layer of titanium on a silicon substrate to provide a titanium-coated silicon substrate; and
utilizing plasma-assisted molecular beam epitaxy (PA-MBE) to epitaxially deposit a plurality of indium gallium nitride (InGaN)/gallium nitride (GaN) nanowires extending from the titanium-coated silicon substrate;
wherein nucleation sites on the layer of titanium form bases for the InGaN/GaN nanowires and titanium nitride (TiN) is formed at the bases.

18. The method of claim 17, wherein the InGaN/GaN nanowires are tapered with lateral size increasing from the bases.

* * * * *